United States Patent
Veliadis

(10) Patent No.: US 8,105,911 B2
(45) Date of Patent: Jan. 31, 2012

(54) BIPOLAR JUNCTION TRANSISTOR GUARD RING STRUCTURES AND METHOD OF FABRICATING THEREOF

(75) Inventor: John V. Veliadis, Hanover, MD (US)

(73) Assignee: Northrop Grumman Systems Corporation, Falls Church, VA (US)

(*) Notice: Subject to any disclaimer, the term of this patent is extended or adjusted under 35 U.S.C. 154(b) by 0 days.

(21) Appl. No.: 12/828,646

(22) Filed: Jul. 1, 2010

(65) Prior Publication Data

US 2010/0264427 A1 Oct. 21, 2010

Related U.S. Application Data

(63) Continuation-in-part of application No. 12/285,139, filed on Sep. 30, 2008, now Pat. No. 7,825,487.

(51) Int. Cl.
*H01L 21/331* (2006.01)
(52) U.S. Cl. ........ 438/356; 257/496; 257/509; 257/517; 438/343
(58) Field of Classification Search ............... 257/77, 257/103, 127, 183, 186, 198, 330, 337, 509, 257/622, 496, 517; 438/268, 312, 369, 510, 438/356, 343
See application file for complete search history.

(56) References Cited

U.S. PATENT DOCUMENTS

| | | | |
|---|---|---|---|
| 4,957,875 A * | 9/1990 | Akbar et al. | 438/369 |
| 5,430,324 A | 7/1995 | Bencuya | |
| 5,903,018 A * | 5/1999 | Shimawaki | 257/198 |
| 6,451,659 B1 * | 9/2002 | Delage et al. | 438/312 |
| 2005/0258454 A1 * | 11/2005 | Kumar et al. | 257/211 |
| 2008/0179662 A1 | 7/2008 | Hshieh | |
| 2008/0211064 A1 * | 9/2008 | Orner et al. | 257/622 |

OTHER PUBLICATIONS

Yo Han Kim, et al.; A New Edge Termination Technique to Improve Voltage Blocking Capability and Reliability of Field Limiting Ring for Power Devices; 2008 IEEE.

Hyung-Seok Lee, et al.; Fabrication and Characterization of Silicon . . . ; KTH, Royal Institute of Tech.; Dept. of Microelectronics and Applied Physics, Device Tech. Lab; 2008.

* cited by examiner

Primary Examiner — Thanh V Pham
Assistant Examiner — Errol Fernandes
(74) Attorney, Agent, or Firm — Andrews Kurth LLP

(57) ABSTRACT

Semiconductor devices with multiple floating guard ring edge termination structures and methods of fabricating same are disclosed. A method for fabricating guard rings in a semiconductor device that includes forming a mesa structure on a semiconductor layer stack, the semiconductor stack including two or more layers of semiconductor materials including a first layer and a second layer, said second layer being on top of said first layer, forming trenches for guard rings in the first layer outside a periphery of said mesa, and forming guard rings in the trenches. The top surfaces of said guard rings have a lower elevation than a top surface of said first layer.

10 Claims, 9 Drawing Sheets

BIPOLAR JUNCTION TRANSISTOR GUARD RING STRUCTURES AND METHOD OF FABRICATING THEREOF

RELATED APPLICATIONS

This application is a continuation-in-part of U.S. patent application Ser. No. 12/285,139, entitled "Guard Ring Structures and Methods of Fabricating Thereof," filed Sep. 30, 2008, which is hereby incorporated by reference.

FIELD

The invention relates generally to semiconductors, and more particularly, to a method of fabricating semiconductor devices with a trenched guard ring structure.

BACKGROUND

Silicon carbide (SiC) and Gallium nitride (GaN) are wide band-gap semiconductors that will displace silicon (Si) in specialized high-voltage and high frequency applications due to their capability to achieve high voltage breakdown with low associated on-resistance, which also permits operation at higher frequencies. In addition, SiC has a thermal coefficient that is more than three times that of Si and has been operated well beyond the 120° C. limit of Si. SiC is more mature than GaN from a manufacturing/processing perspective and transistors have been demonstrated for power conditioning applications in hybrid cars, more electric aircraft, and radar power supplies.

Three types of SiC devices are reaching maturity for power conditioning applications: SiC MOSFET (metal oxide semiconductor field effect transistor), SiC VJFET (vertical junction field effect transistor), and SiC BJT (bipolar junction transistor). The SiC BJT can be used as a single normally-off switch that can directly replace Si MOSFET switches. As in MOSFET and VJFET cases, the size of the SiC BJTs is primarily limited by the defects in the SiC material. An additional problem particular to BJTs is the forward voltage degradation that is caused by the growth of stacking faults from certain basal plane dislocations within the base layer of the SiC BJT (see, e.g., Agarwal et al., Materials Science Forum Vols. 527-529 (2006), pp. 1409 to 1412). The BJT is a current controlled device and achieving high current gain in SiC BJTs is essential for power switching applications. The BJT, much like the VJFET, can operate at temperatures well above those of Si; operation at 275° C. has been reported by several groups. The BJT can be used in RF applications similar to VJFETs and SITs.

For high voltage applications above 150° C. (hybrid vehicles, more electric aircraft, power supplies, etc.), the SiC VJFET and BJT are the viable SiC candidates for power conditioning applications. The BJT has the drawback of being a current controlled device which necessitates high current gain for efficient gate drive operation. The forward voltage degradation issue also needs to be resolved. As SiC material quality improves, forward voltage degradation and high current gain will improve. With material issues resolved, the BJT might be a more cost effective solution compared to the VJFET as it is a single normally-off replacement to Si MOSFETs. Furthermore, BJTs can be used at very high voltages (beyond 3000 V) where unipolar devices like the MOSFET and VJFET are unsuitable due to the high resistivity of their drift layer.

For optimum SiC BJT performance, it is important to obtain a device breakdown voltage as close as possible to the intrinsic capability of the underlying semiconductor material. However, the breakdown voltage of practical devices is reduced by the occurrence of high electric fields at the edges of the device. In particular, electric field crowding at the edges of the device leads to premature voltage breakdown. To minimize premature voltage breakdown, specialized edge termination structures must be implemented in order to obtain maximum breakdown voltage with relatively low associated on-state resistance.

The multiple floating guard ring (MFGR) edge termination structure is used to alter the charge distribution and electric field at surfaces and material interfaces of semiconductor devices. The interface between the guard ring and the substrate in which it is embedded forms a depletion region that enhances resistance to voltage breakdown in an applied field. The MFGR also provides a cost-effective method of edge termination because it may use fewer fabrication steps than the Junction Termination Extension technique, another technique for edge termination.

There are two major drawbacks to the present state of the art fabrication approach that limit the maximum breakdown voltage that can be achieved by the BJT using MFGR.

1. By defining the rings in a distinct lithography step using customary resist-dielectric methods, breaks in the rings may occur. In particular, a break in the first ring (which commonly happens close to the corner of the MESA edge) will render the SiC device's breakdown voltage well below specification.

2. The N-doped layer surface of the BJT, inside which the guard rings are situated, is customarily covered by dielectrics (oxides) for isolation and reliability purposes. One potentially critical issue with the MFGR edge termination is that it is very sensitive to the charge at the oxide semiconductor interface. Isolation oxides in SiC devices are typically plasma deposited and the plasma processing steps may result in the incorporation of high levels of oxide charges. As a result, field oxides in SiC may be lower quality when compared to high quality thermally grown oxides. When a large amount of positive charge is present in the oxide-semiconductor interface, the surface of the lightly doped n-layer turns into n+ regions (in the semiconductor-oxide interface between the p+ rings). This results in a very high electric field at the oxide-semiconductor interface. The high electric field reduces the effectiveness of the floating guard rings and may result in reduction of blocking voltage of the devices (Yilmaz, IEEE Transactions on Electron Devices, Vol. 38. No. 7, pp. 1666-1675, 1991). In addition, this charge, mostly positive, can move toward or away from the oxide-semiconductor interface, causing time dependant breakdown voltage, or breakdown walk-out. Breakdown walk-out refers to the phenomenon where the breakdown voltage starts at a first value and degrades with time and bias. Both time dependant breakdown voltage and breakdown walk-out impact long term device reliability and are highly undesirable.

One way to overcome the surface charge sensitivity and long term reliability issues of MFGR edge terminations is to introduce Offset Field Plates on each guard ring as suggested by Yilmaz for Si power devices. Although this can be implemented relatively easily in Si, it is not practical for SiC devices due to alignment tolerance, step coverage, and oxide quality issues. In addition, introducing Offset Field Plates requires a first lithography level to pattern windows on the oxide and a second lithography level for the field plates. In field plate designs the quality of the oxide is important in achieving acceptable results as it is the oxide that supports the voltages. As mentioned before, the deposited oxides in SiC are of lower quality and accordingly, the Offset Field Plates method becomes ineffective.

SUMMARY

Embodiments described herein overcome the disadvantages of the prior art. These and other advantages are achieved by, for example, a method for fabricating guard rings in a semiconductor device that includes forming a mesa structure on a semiconductor layer stack, the semiconductor stack including two or more layers of semiconductor materials including a first layer and a second layer, said second layer being on top of said first layer, forming trenches for guard rings in the first layer outside a periphery of said mesa, and forming guard rings in the trenches. The top surfaces of said guard rings have a lower elevation than a top surface of said first layer.

These and other advantages are also achieved by a semiconductor device that includes a first layer and a second layer on top of said first layer, trenches formed in and defined by said first layer, and guard rings formed in said trenches. The top surfaces of said guard rings are lower than a top surface of said first layer.

DETAILED DESCRIPTION DRAWINGS

The detailed description will refer to the following drawings, wherein like numerals refer to like elements, and wherein.

DETAILED DESCRIPTION

Figure 1:
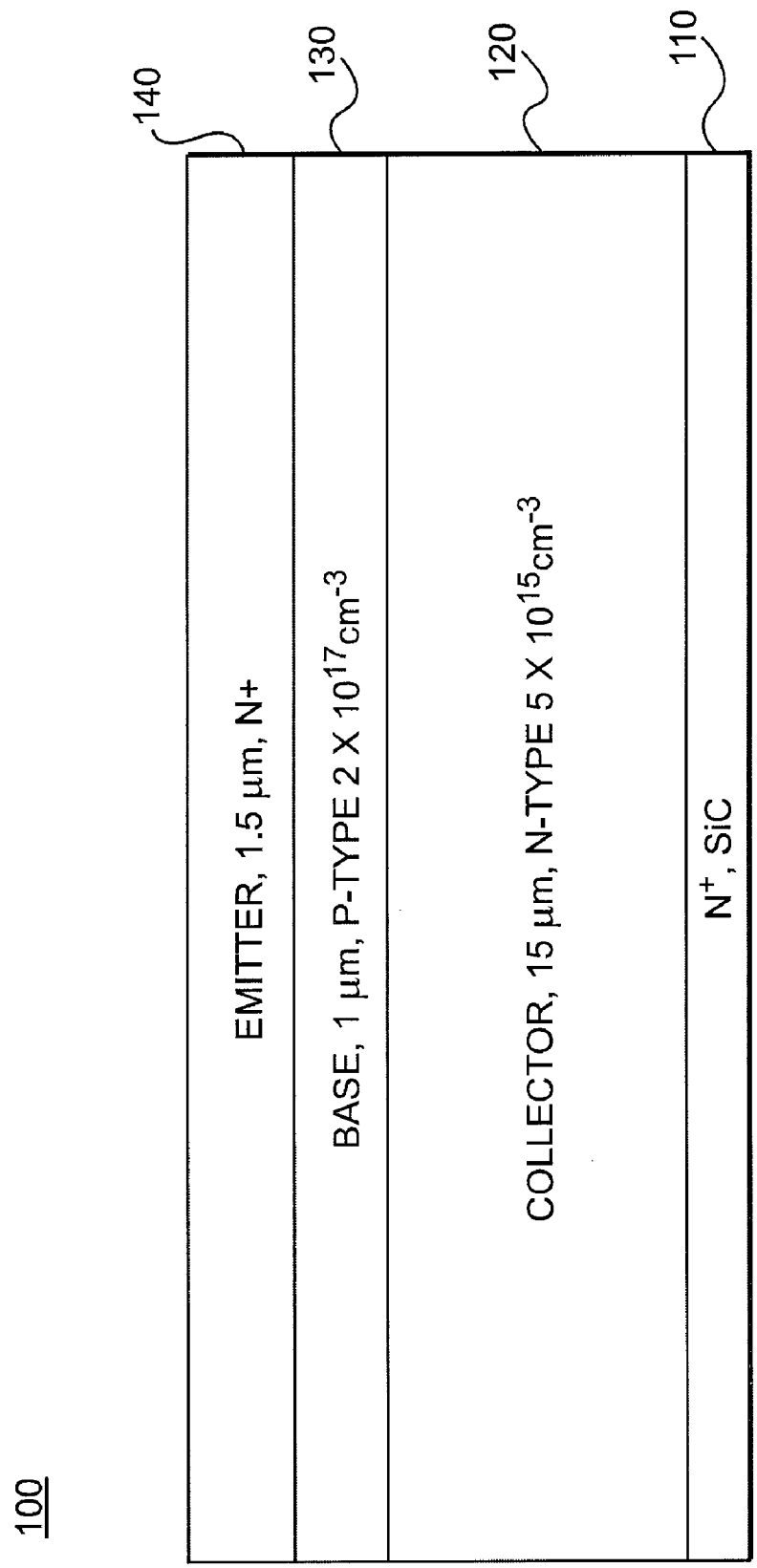
FIG. 1 is a schematic of a semiconductor layer stack used to form embodiments of a semiconductor device that includes trenched multiple floating guard ring (MFGR) edge termination structures.

Described herein are embodiments of semiconductor devices with trenched multiple floating guard ring (MFGR) edge termination structures and methods of fabricating the same that overcome the disadvantages of the prior art described above. Such MFGR edge terminations maximize the voltage breakdown of BJTs (and other semiconductor devices). Such MFGR edge termination structures, and methods of fabricating same, are applicable to both SiC and GaN BJTs. Indeed, BJTs described herein may be formed from a variety of wide bandgap materials including SiC, GaAs, GaN, $Al_xGaN_{1-x}$/GaN, $In_xGa_{1-x}$N/GaN, Si, sapphire, and diamond, wherein $0<x<1$. Embodiments include a self aligned MFGR structure that maximizes the breakdown voltage capability of the BJT, thereby minimizing the on-resistance (and as a result the resistive losses) for a given breakdown voltage specification.

The embodiments disclosed form trenched guard ring structures which make the guard rings insensitive to dielectric surface charges as the area between the implanted guard rings is not in direct contact with the overlying dielectric. Oxide charges and changes of same do not impact the effectiveness of the trenched MFGR structure as the depletion region that under bias extends from the main junction to the end of the outermost guard ring is not in contact with the charge concentrations in the oxide-semiconductor interface. Moreover, fabricating the MFGR structure in a trenched process virtually eliminates the occurrence of broken rings.

This description is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "front," "back," "up," "down," "top" and "bottom," as well as derivatives thereof, should be construed to refer to the orientation as then described or as shown in the drawing figure under discussion. These relative terms are for convenience of description and normally are not intended to require a particular orientation. Terms concerning attachments, coupling and the like, such as "connected" and "attached," refer to a relationship wherein structures are secured or attached to one another either directly or indirectly through intervening structures, as well as both movable or rigid attachments or relationships, unless expressly described otherwise.

In describing various embodiments, specific terminology is employed for the sake of clarity. However, the invention is not intended to be limited to the specific terminology so selected. It is to be understood that each specific element includes all technical equivalents which operate in a similar manner to accomplish a similar purpose.

In the drawings described herein, the sizes of layers or regions are exaggerated for illustrative purposes. Processing of a SiC substrate with NPN BJT epitaxial layers is used to exemplify aspects of the embodiments described herein. An exemplary wafer includes a SiC substrate with an n-type collector region, a p-type base region, and an n+ emitter region. Although embodiments are illustrated on an NPN BJT, those skilled in the art will recognize that it can be equally easily applied to a PNP BJT without deviating from the inventive spirit described herein.

With reference now to FIG. 1, shown is an embodiment of an epitaxial schematic for fabrication of an NPN BJT 100. The semiconductor layer stack 100 shown includes a n+ SiC substrate 110. After the growth of a n-type collector region or layer 120 on a n+ substrate 110, a p-type base region or layer 130 and a heavily doped n+ emitter region or layer 140 are grown. As an example, the collector layer 120 is 15 μm thick, the base layer 130 is 1 μm thick, and the emitter layer 140 is 1.5 µm thick. The collector, base, and emitter can vary in thicknesses and doping levels and additional layers may be included to achieve an optimal BJT design. As those skilled in the art will recognize, the disclosed method of termination and fabrication techniques can be implemented in these cases without deviating from the spirit of the present invention.

The collector region is typically doped in the $10^{15}$-$10^{16}$ cm$^{-3}$ range. The base region is typically doped in the $5 \times 10^{16}$-$10^{18}$ cm$^{-3}$ range. The emitter region is typically highly doped in excess of $5 \times 10^{18}$ cm$^{-3}$.

The semiconductor stack or wafer 100 shown in FIG. 1 is a SiC semiconductor layer stack. The semiconductor layer stack may also be formed with GaN, as noted above. Moreover, even though the semiconductor stack is used to form a NPN BJT, the methods and designs shown herein may be equally applied to a semiconductor stack for forming a PNP BJT.

Figure 2:
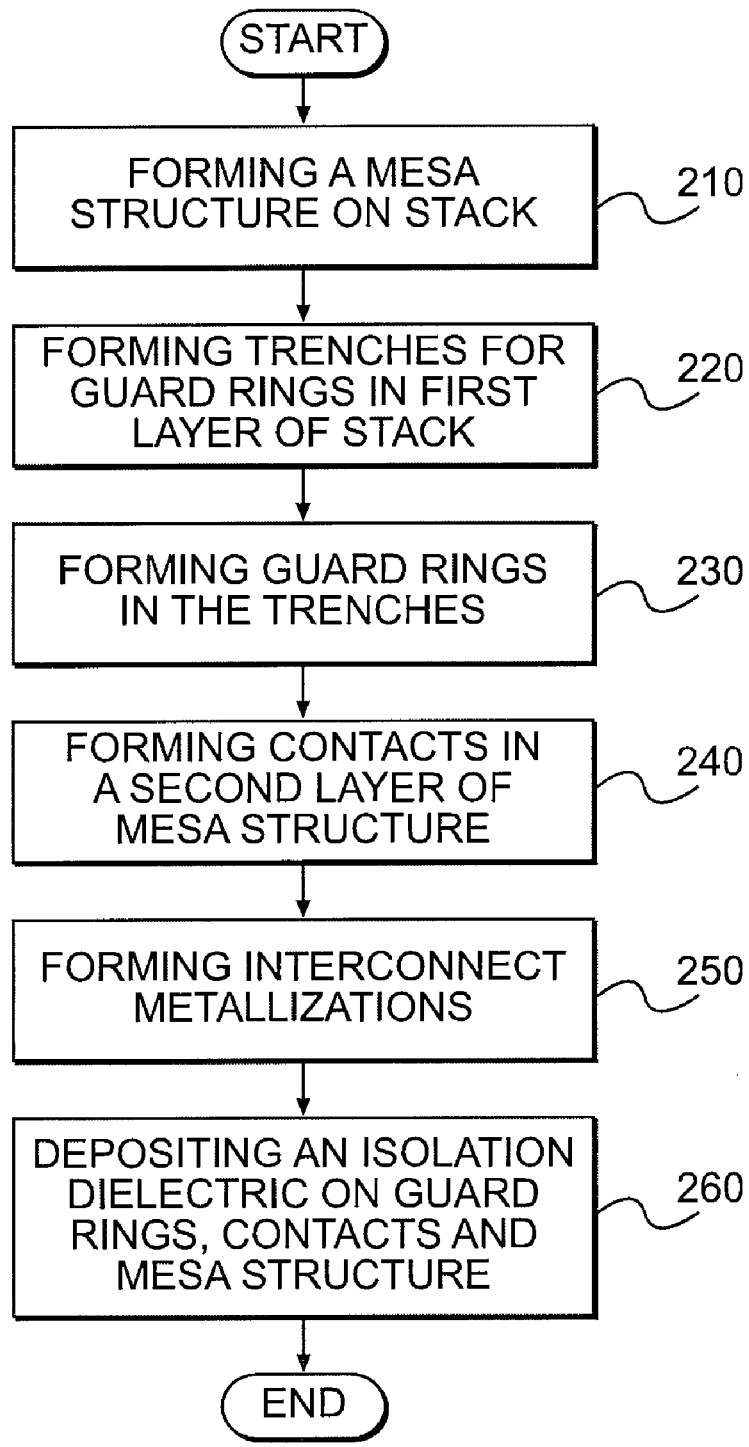
FIG. 2 is a flowchart illustrating an embodiment of a method of fabricating semiconductor devices that includes trenched multiple floating guard ring (MFGR) edge termination structures.

With reference now to FIG. 2, shown is an embodiment of a method 200 for fabricating a trenched multiple floating guard ring (MFGR) structure in a BJT. The method 200 includes: forming a mesa structure on a semiconductor layer stack, block 210, forming trenches for guard rings in a first layer of the semiconductor layer stack outside a periphery of the mesa structure, block 220, and forming guard rings at the bottom of the trenches, block 230, with top surfaces having a lower elevation than a top surface of the first layer. Embodiments of the semiconductor stack include the first layer, a second layer on top of the first layer, and a third layer on top of the second layer. Forming 210 the mesa structure may be performed by removing portions of the second layer and third layer from the first layer, e.g., by etching, to form the mesa structure. Indeed, mesa structure may be portion of second and third layer not removed from semiconductor stack. In an embodiment, the first layer is a collector region, e.g., collector layer 120, the second layer is a base region, e.g., base layer 130, and third layer is an emitter region, e.g., emitter layer 140, of the BJT semiconductor device.

Method 200 forming contacts in the second layer in the mesa structure, block 240. Indeed, forming guard rings 230 and forming contacts 240 may be performed as a single step in the same dopant implantation process. In embodiments, the contacts are formed in said second layer in the mesa structure. Method 200 may further include forming interconnect metallizations on the contacts, block 250 and depositing an isolation dielectric on said guard rings, contacts and mesa structure, block 260.

With reference again to FIG. 1, a lithography mask may be created on the SiC semiconductor layer stack 100 and etched through to form 210 the mesa structure. For the stack 100 shown, the etch depth would be equal to or greater than 2.5 um deep in order to expose the collector layer 120 in the non-masked areas. The lithography mask may be created by patterning resist on the semiconductor layer stack 100 (resist mask), patterning a dielectric deposited on the semiconductor layer stack 100 (dielectric mask), patterning a metal mask over blanket deposited dielectric (metal mask), combinations thereof or other suitable semiconductor masking process. The etching may be accomplished by reactive-ion etching (RIE) or inductively-coupled plasma (ICP) etching, or other etching techniques, with the lithographic mask preventing etching over the masked areas. Controlling the etch depth to expose the n-type collector area 120 can be accomplished by a combination of etch depth measurements and electrical probings. As the n-type collector layer 120 has a doping that is approximately two orders of magnitude lower than that of the p-type base layer 130 immediately above, the collector layer 120 possesses different electrical characteristics that can be exploited through electrical probings to determine the etch-stop point.

Figure 3:
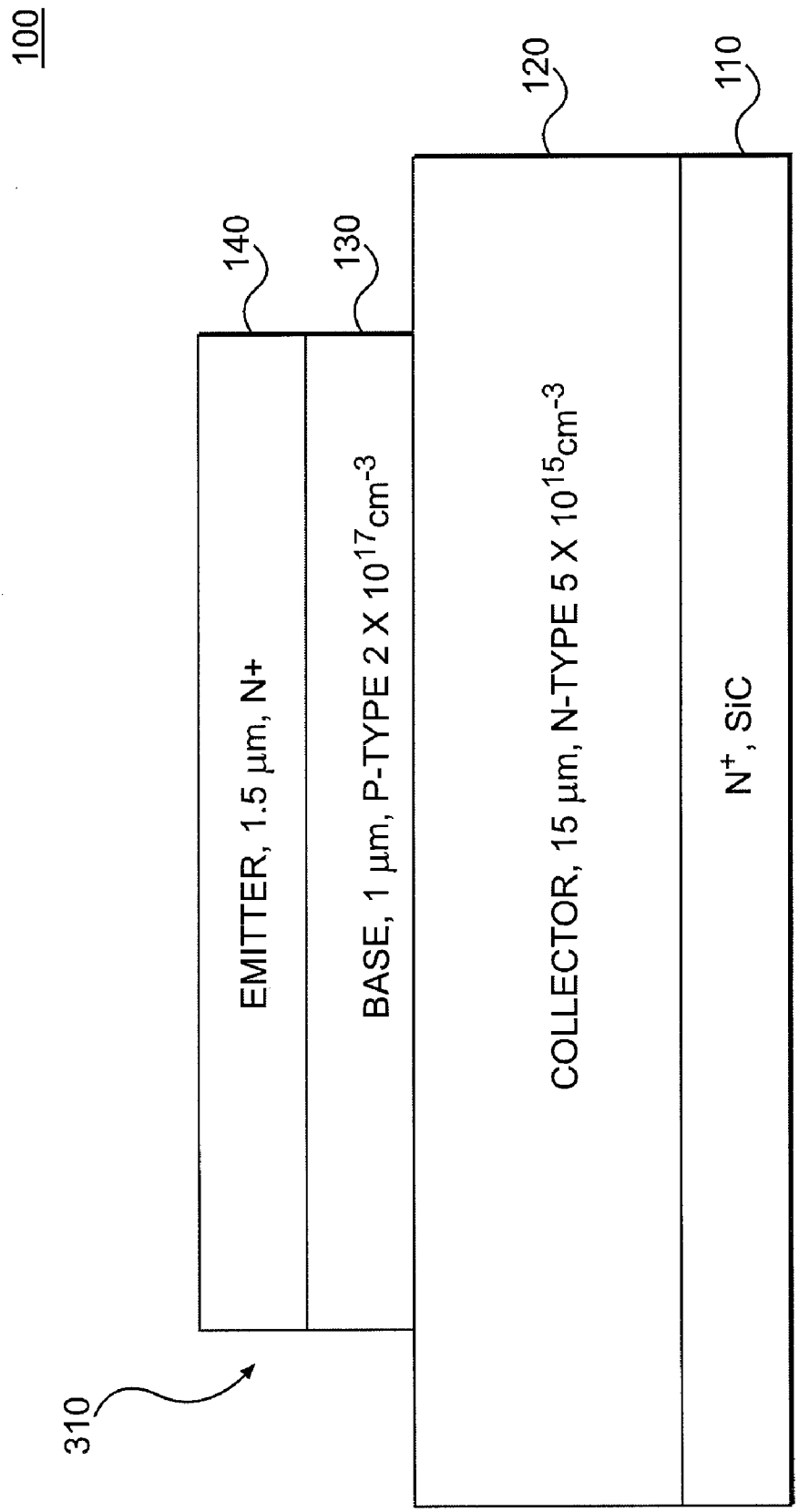
FIG. 3 is a schematic of a semiconductor layer stack, used to form embodiments of a semiconductor device that includes trenched multiple floating guard ring (MFGR) edge termination structures, in which a mesa structure has been formed.

With reference now to FIG. 3, shown is semiconductor layer stack or wafer 100 after formation of the initial mesa structure 310 (e.g., after completion of base-emitter etch and removal of etch mask). As described, portions of the second and third layers, i.e., base region 130 and emitter region 140, have been etched away to form mesa structure 310. It should be noted that the views shown in FIGS. 1 and 3-7 are cross-sectional views of semiconductor layer stack 100 and subsequently formed BJT with trenched multiple floating guard ring (MFGR) edge termination structures. In a typical implementation, mesa structure 310 may be sloped, round or rounded and the MFGR edge termination structures will be actual rings surrounding the mesa structure 310.

Figure 4A:
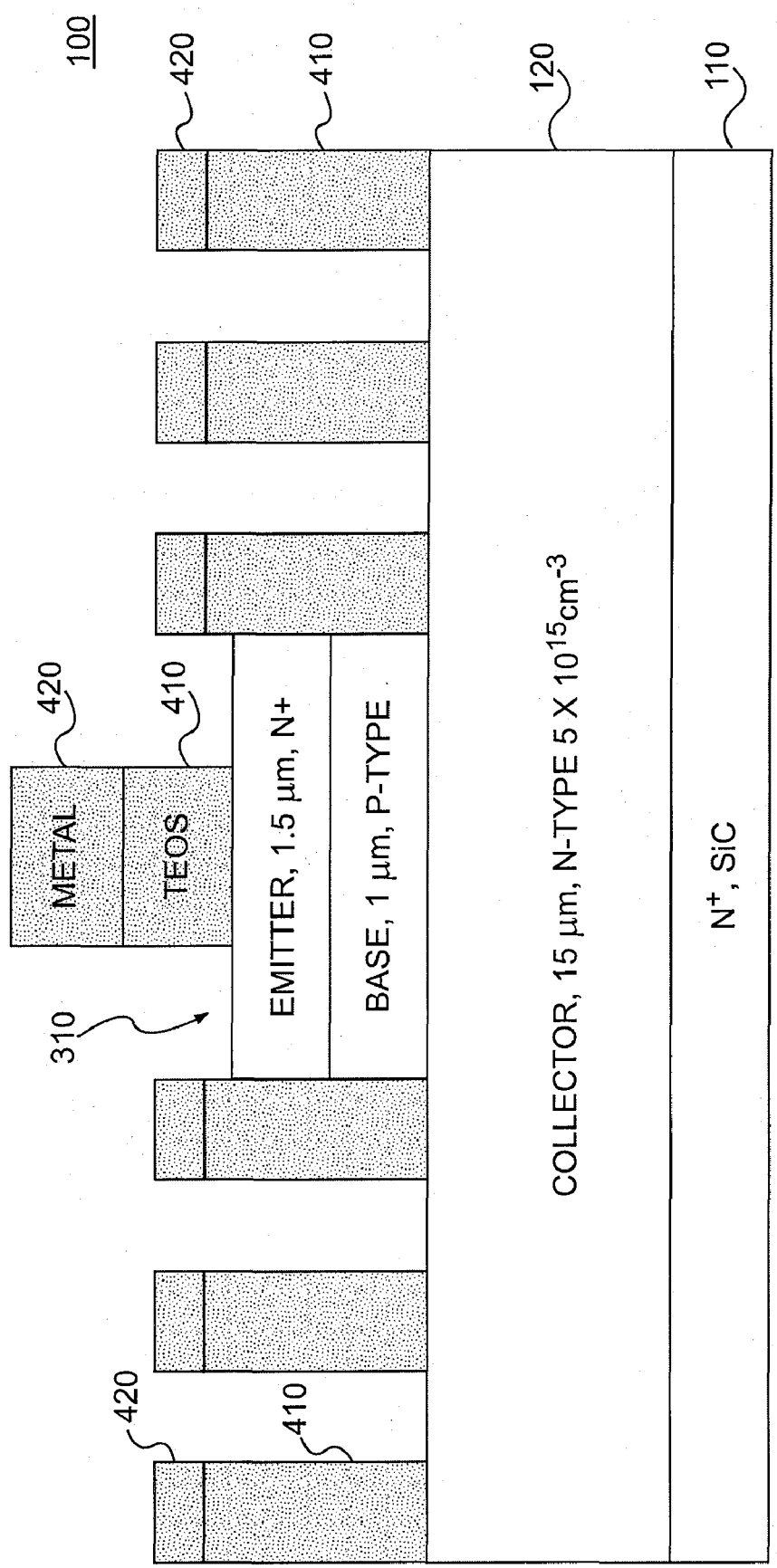
FIGS. 4A-4B are schematics of a lithographic mask on a semiconductor layer stack, used to form embodiments of a semiconductor device that includes trenched multiple floating guard ring (MFGR) edge termination structures, in which trenches have been formed.
Figure 4B:
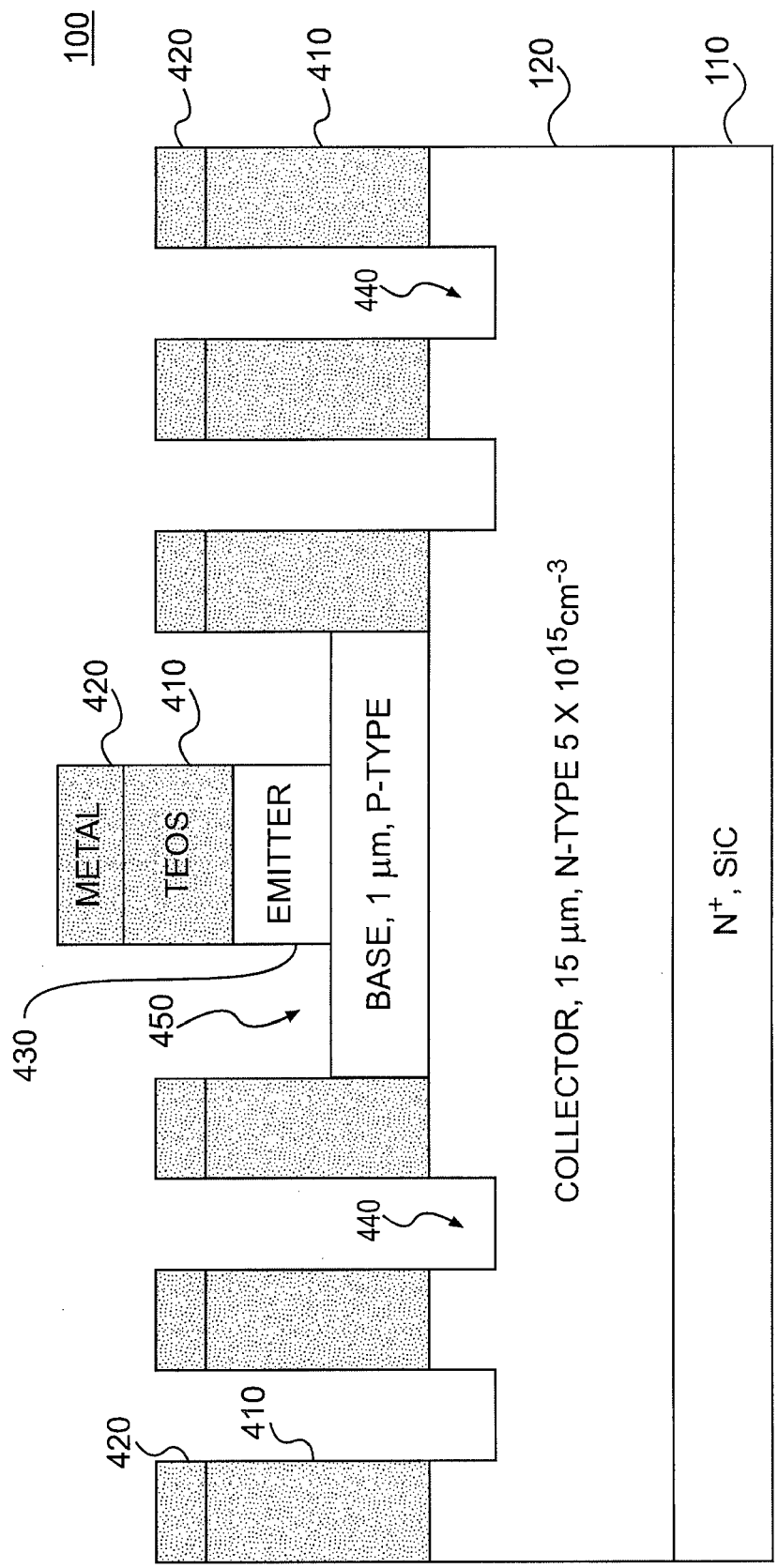

With reference now to FIGS. 4A-4B, shown is semiconductor layer stack or wafer 100 with a dielectric (e.g., TEOS oxide) layer 410 patterned using a metal mask 420 illustrating intermediate and completed aspects of forming trenches (and base regions) for guard rings (and base contacts). The dielectric layer 410 (e.g., Tetraethyl-orthosilicate "TEOS" oxide) is blanket deposited on the wafer 100. Thermal oxidation of the wafer, prior to TEOS deposition, may be performed to enhance TEOS adhesion to the wafer 100 surface. A metal mask 420 may be formed over the dielectric layer 410 and the dielectric layer 410 is etched in the non-metal mask covered areas. Alternatively, a resist mask may be used to pattern the dielectric 410, and the dielectric 410 etched in the non-resist mask covered areas. A metal mask 420 has the advantage of maintaining the thickness and profile of the originally deposited dielectric 410 over the mask covered areas. This is desirable as this same dielectric may be subsequently used as an implantation mask (see below). The wafer 100 after the dielectric layer 410 is patterned using the metal mask and etched to the level of the collector layer 120 and emitter layer 140, is shown in FIG. 4A. Again, RIE or ICP etching, or other type of etching, can be used for this etch. The stop-etch point may be determined by a combination of etch depth measurements and electrical probings. As the p-type base layer has a doping that is approximately two orders of magnitude lower than that of the heavily n+ doped emitter layer immediately above it, it possesses different electrical characteristics that can be exploited through electrical probings to determine the etch stop point.

Subsequently, a 1.5 µm etch on the wafer 100 defines the emitter regions 430, the trenches 440 where the guard ring implantation will take place, and the exposed base regions 450 on portions of which contact implantation will take place. With reference now to FIG. 4B, shown is wafer 100 after completion of etching of emitter layer and of collector region trenches. Forming 220 trenches (and forming 240 emitter regions) may be performed as illustrated and described with reference to FIG. 4B. As shown, the etching process described above continues (using the same metal mask 420) until the 1.5 µm emitter material 140 has been totally etched in the non-metal mask covered areas, forming emitter regions 430. At the same time, the collector region 120 is etched to form trenches 440 at the positions to be implanted for p-type guard-ring formation. The dielectric (e.g., oxide) and subsequent semiconductor etches can be done using different etch chemistries. For example, specific etch chemistries remove oxide faster while other chemistries are better suited for semiconductor material etching. At the end of the emitter/trenched guard-ring etch, the wafer looks shown in FIG. 4B. As noted above, FIGS. 4A-4B illustrate a single lithographic step that may be performed in embodiments of method of fabricating a trenched multiple floating guard ring (MFGR) structure in a BJT. The intermediate "etching" state of FIG. 4A is shown to better illustrate the single emitter/trenched guard-ring lithography level that culminates in the schematic of FIG. 4B.

At completion of the emitter region etch, the metal mask 420 may be removed using standard semiconductor processing techniques that leave the dielectric (e.g., TEOS oxide) 410 and semiconductor areas (collector 120, base 130, and emitter 140 layers) unaffected.

Figure 6:
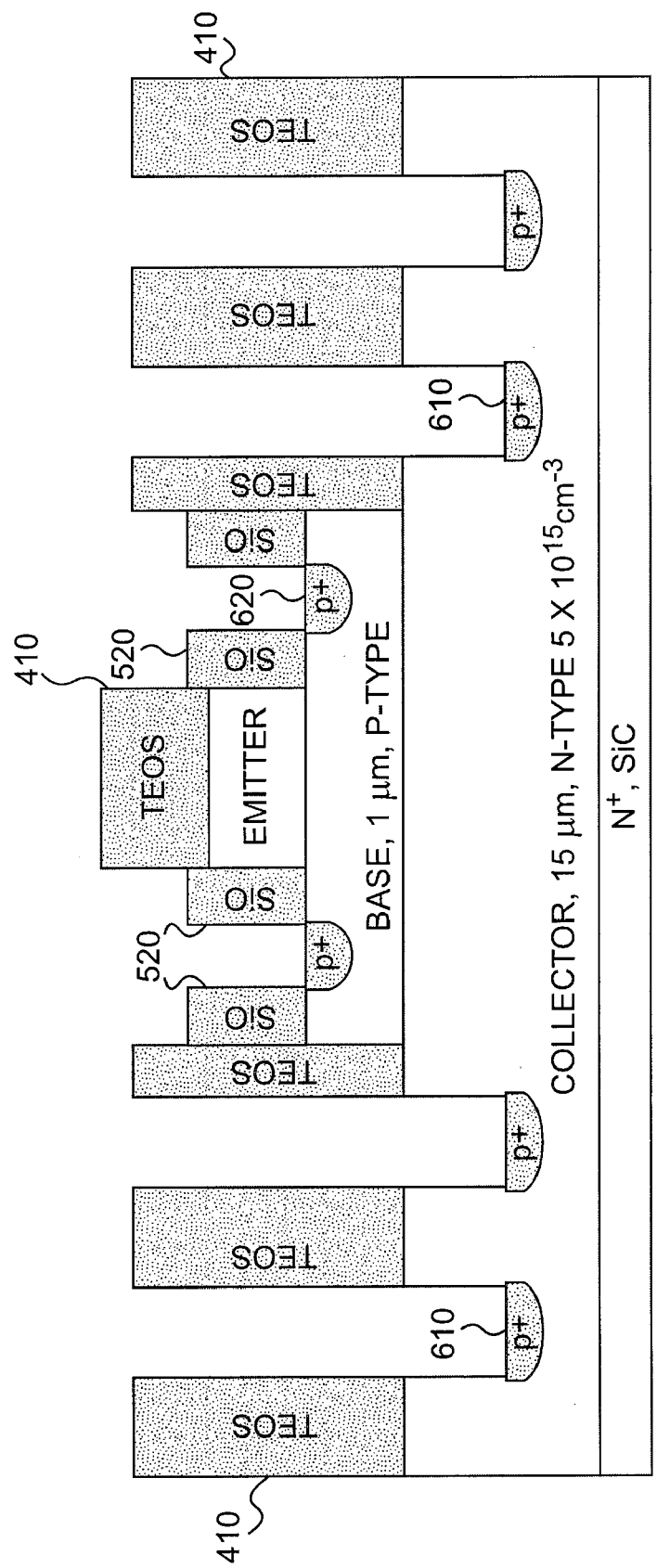
FIG. 6 is a schematic of a lithographic mask on a semiconductor layer stack, used to form embodiments of a semiconductor device that includes trenched multiple floating guard ring (MFGR) edge termination structures, in which implantation forming MFGR edge termination structures and contacts has been completed.

The following describes an exemplary process of forming 230 guard rings (and forming contacts 240), with the actual formation described with reference to the implantation shown in FIG. 6. After completion of the emitter region etch, standard semiconductor lithography resist may be patterned in a way so that the resist covers the semiconductor base layer 130 in areas where implantation (e.g., p+ implantation) is to take place to form contacts, the resist covers the periphery of the mesa where guard rings are formed, and the resist covers the TEOS oxide situated on top of the emitter region. Subsequently, a dielectric that can be lifted off may be deposited over the wafer 100 (blanket coating). An example of a dielectric that can be lifted off is SiO.

Figure 5:
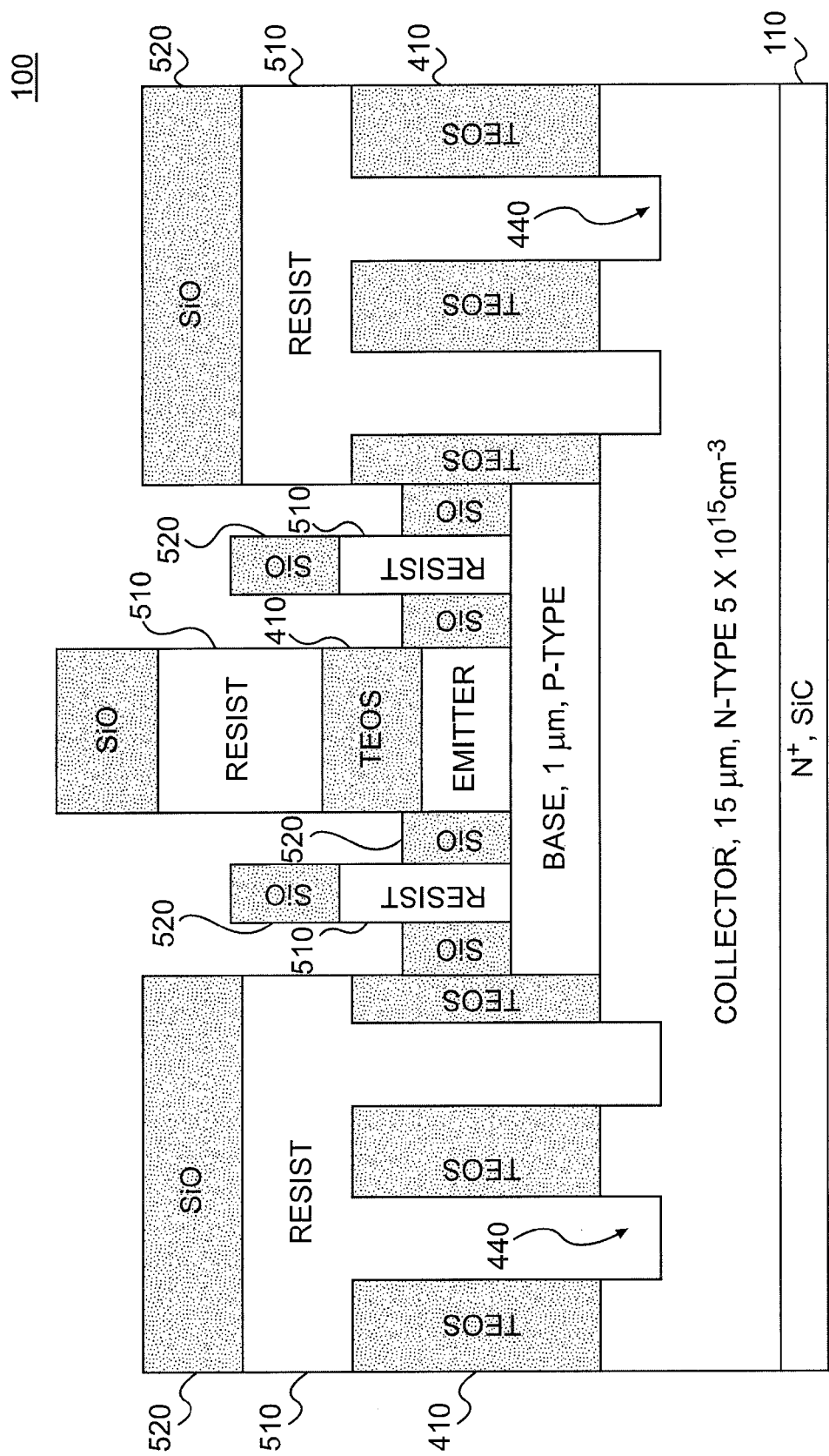
FIG. 5 is a schematic of a lithographic mask on a semiconductor layer stack, used to form embodiments of a semiconductor device that includes trenched multiple floating guard ring (MFGR) edge termination structures, in which trenches have been formed and dielectric deposition has been completed.

With reference now to FIG. 5, shown is semiconductor layer stack 100 after resist patterning and dielectric deposition. Shown is wafer 100 with previously etched dielectric layer (e.g., TEOS oxide) 410, resist 510, and blanket deposited dielectric (e.g., SiO) 520. Resist 510 covers trenches 440 and portions of the exposed base region 450 where implantation to form guard rings and contacts, respectively, will occur.

Subsequently, resist 510 may be lifted off, removing resist 510 and dielectric (e.g., SiO) 520 situated on top of resist 510. As shown in FIG. 6, this leaves wafer 100 patterned with dielectrics 410 and 520 (e.g., TEOS and SiO) over the BJT areas where p+ implantation is not desirable. The resist 510 lifts the dielectric 520 throughout the wafer area outside of the exposed base region 450. In typical BJT designs, the remaining emitter 140 width is approximately 10 μm, and the areas on the base 130 that get p+ implanted are each approximately 5 μm wide. The spacings of the base implanted areas from the emitter 140 and the edges of the base region are typically 5 μm or wider. As a result, the resist assisted dielectric 520 lift-off has relatively wide dimensions.

In the subsequent implantation step that follows, areas covered by the dielectrics 410 and 520 are protected and do not get implanted. FIG. 6 illustrates wafer 100 with p+ implantation at the bottom of the trenches and in the areas of the base 130 not covered by dielectric, forming guard-rings 610 and contacts 620. The dielectrics 410 and 520 may be subsequently removed by a single wet etch. Standard high temperature annealing for surface passivation and implant dopant activation may follow. Finally, isolation dielectrics and interconnect metallizations may be implemented using standard semiconductor processing techniques.

Figure 7:
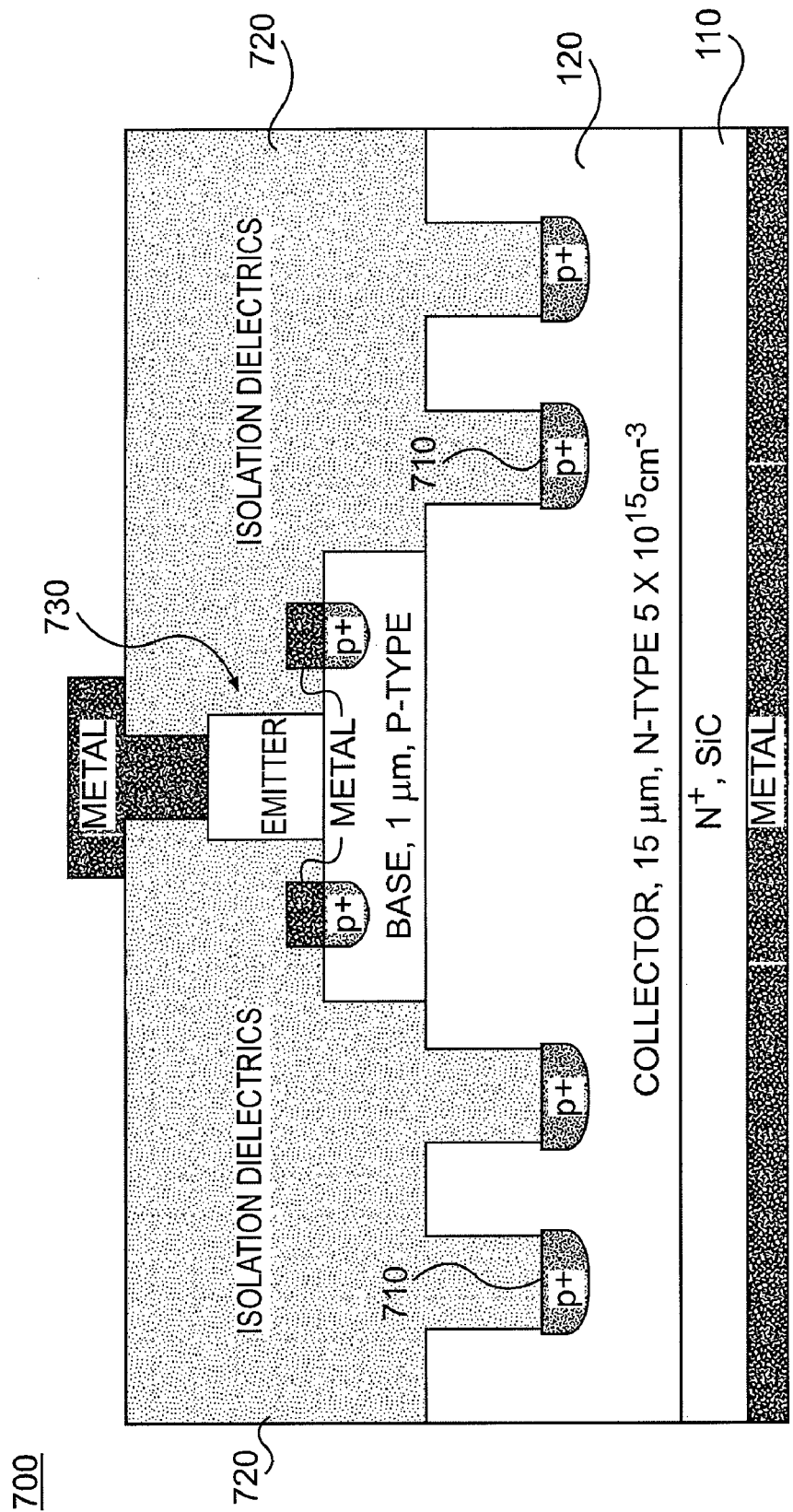
FIG. 7 is a schematic of an embodiment of a semiconductor device that includes trenched multiple floating guard ring (MFGR) edge termination structures.

With reference now to FIG. 7, shown is a schematic of an embodiment of a BJT 700 with trenched multiple floating guard ring (MFGR) edge termination structures 710. As noted above, the view shown in FIG. 7 illustrates a two-dimensional cross-sectional view of BJT 700. Also shown here are isolation dielectrics 720 and metallizations of the emitter region 730, the base region, and the collector region.

As noted above, mesa 310 may be sloped, round or rounded in nature and MFGR edge termination structures 710 may be actual rings surrounding mesa 310. Moreover, although FIG. 7 shows a MFGR edge termination structure with only two rings (trenches 440 on either side of mesa 310 are opposing sides of same rings), BJT 700 may include a MFGR edge termination structure with many more rings. In the BJT schematics, the spacing between the p-type SiC guard rings 710 is illustrated as constant and only two guard rings 710 are shown for simplicity. In the disclosed BJT MFGR edge termination, the number of concentric trenched guard rings 710, their thicknesses (widths), and spacings can vary in order to maximize the breakdown voltage. Typical guard ring spacings are in the 1 micron to 10 micron range. Typical guard ring thicknesses are in the 1.5 micron to 6 micron range.

In the drawings described herein and in the interest of clarity and conciseness, a single emitter region 430 is shown between two p+ base contacts. It is understood that this represents a single emitter-region/base-contact cell and numerous of these cells may be part of the mesa that is surrounded by the multiple floating ring edge termination.

The described process flow, which leads to the formation of a trenched MFGR edge termination, eliminates the problem of broken guard rings that may appear in the standard non-trenched MFGR edge termination process. In addition, the trenched MFGR edge termination is insensitive to the charge at the oxide-semiconductor interface. As explained previously, the presence of charge in the dielectric creates a high electric field which reduces the effectiveness of standard floating guard rings and may result in reduction of blocking voltage capability and reliability of the devices (See Yilmaz, IEEE Transactions on Electron Devices, Vol. 38. No. 7, pp. 1666-1675, 1991). In prior art floating guard rings, positive charges in the isolation dielectric move toward the n-doped surface between the p+ doped guard rings and turn these regions into heavily n+ doped areas. The resultant high electric field regions between the guard rings interfere with the operation of the prior art guard ring structure and reduce its blocking capability.

As explained previously, U.S. Pat. No. 7,026,650 (the '650 patent) introduces a p-doped surface charge compensation region between the main junction and between the floating guard rings and adjacent to the dielectric insulating layer. The surface charge compensation region alleviates the effects of the positive charge build-up in the oxide-semiconductor interface. Implementation of this technique, however, requires at least one additional lithographic level and one additional dopant implantation. These result in increased manufacturing costs and cycle times. Implementation of the charge compensation region by epitaxial growth of an additional layer, also suggested in the '650 patent, is impractical as it complicates the design and increases manufacturing costs. Furthermore, fabricating non-trenched rings as in the '605 patent may lead to poor blocking voltage performance as a result of ring breaks during processing.

Figure 8:
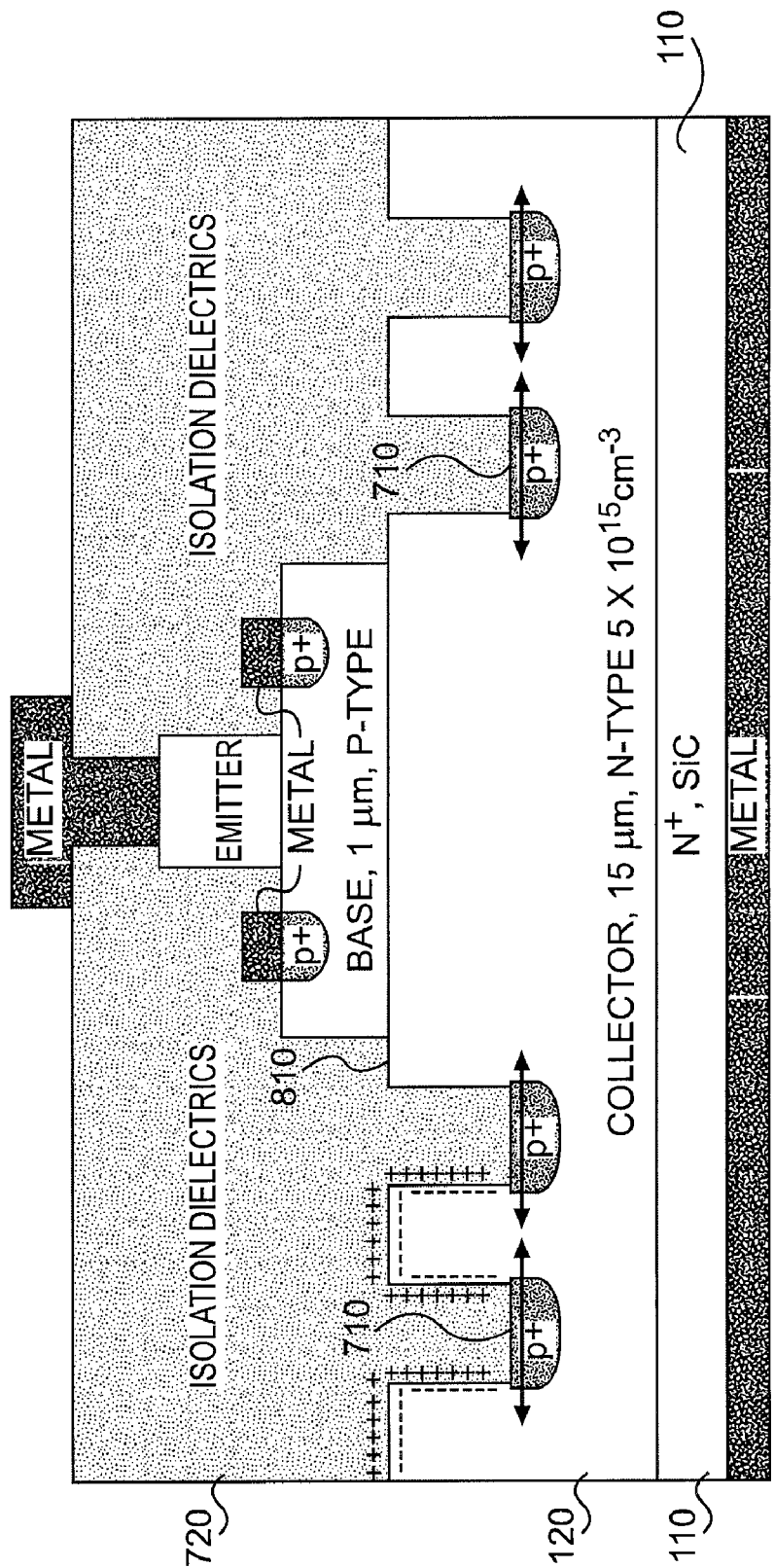
FIG. 8 is a schematic of an embodiment of a semiconductor device that includes trenched multiple floating guard ring (MFGR) edge termination structures illustrating insensitivity of MFGR edge termination structures to charge at dielectric-semiconductor interface.

With reference now to FIG. 8, the disclosed trenched MFGR structure is insensitive to the charge at the dielectric-semiconductor interface, without the use of additional mask levels, implantation events, or epitaxial growths of additional layers. Positive charges in the isolation dielectric 720 accumulate at the n-doped collector/dielectric interface (denoted by "+"). This turns the collector regions 120 at the interface into heavily doped n+ regions (denoted by "−"). As the resultant high electric fields are away from the depletion area of the MFGR edge termination structures 710 (the direction of the depletion spread with voltage is denoted by the double arrow), the high electric fields do not interfere with the voltage blocking operation of the MFGR edge termination structures 710. As the base region 130 doping is typically over two orders of magnitude higher than that of the collector region 120, a depletion region covers the majority of the collector mesa edge 810 that constitutes a sidewall of the first guard ring. Consequently, the collector mesa-edge/dielectric interface has negligible surface charge accumulation. Based on the above discussion, the disclosed trenched MFGR structure 710 is insensitive to the charge at the dielectric-semiconductor interface.

The trenched MFGR edge termination structure and fabrication method embodiments described herein stop the oxide-semiconductor charge build-up from interfering with the operation of the MFGR termination structure 710 by shifting the oxide-semiconductor charge away from the guard ring depletion region without introducing additional manufacturing steps or difficulty, increasing manufacturing costs or exposing the guard rings to breaking.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

The invention claimed is:

1. A method for fabricating guard rings in a semiconductor device, comprising
   forming a mesa structure on a semiconductor layer stack wherein the semiconductor stack includes two or more layers of semiconductor materials including a first layer and a second layer, wherein said second layer is on top of said first layer;
   subsequent to forming the mesa structure, forming trenches for guard rings in the first layer outside a periphery of said mesa structure; and
   forming guard rings in the trenches, wherein said trenches and said guard rings are formed in said first layer so that both the said trenches and said guard rings are situated entirely in said first layer and
   wherein top surfaces of said guard rings have a lower elevation than a top surface of said first layer.

2. The method of claim 1 wherein said first layer forms a collector region of the semiconductor device and said second layer forms a base region of the semiconductor device.

3. The method of claim 1 further comprising forming contacts in a top surface of the second layer.

4. The method of claim 3 wherein the forming guard rings and the forming contacts are performed as a single dopant implantation step.

5. The method of claim 3 wherein said mesa structure is formed by etching through said second layer in a portion of said semiconductor layer stack and wherein said contacts are formed in said second layer in said mesa structure.

6. The method of claim 3 further comprising forming interconnect metallizations on said contacts.

7. The method of claim 3 further comprising depositing an isolation dielectric on said guard rings, contacts and mesa structure.

8. The method of claim 1 wherein said semiconductor layer stack further comprises a third layer on top of said second layer, wherein emitter regions are formed in said third layer in the mesa structure of the semiconductor device.

9. The method of claim 8 comprising:
   forming a lithographic mask on top of a portion of the first layer, wherein said mask defines locations of said trenches; and
   forming a lithographic mask on top of a portion of the third layer, wherein said mask defines locations of said emitter regions.

10. The method of claim 9 wherein said forming said trenches includes vertically etching through a portion of said first layer to expose bottoms of said trenches, and wherein said forming said emitter regions includes vertically etching through a portion of said third layer to expose a portion of said second layer.

* * * * *